(12) United States Patent
Rachmady et al.

(10) Patent No.: US 11,894,372 B2
(45) Date of Patent: Feb. 6, 2024

(54) STACKED TRIGATE TRANSISTORS WITH DIELECTRIC ISOLATION AND PROCESS FOR FORMING SUCH

(71) Applicant: Intel Corporation, Santa Clara, CA (US)

(72) Inventors: Willy Rachmady, Beaverton, OR (US); Cheng-Ying Huang, Portland, OR (US); Gilbert Dewey, Beaverton, OR (US); Aaron Lilak, Beaverton, OR (US); Patrick Morrow, Portland, OR (US); Anh Phan, Beaverton, OR (US); Ehren Mannebach, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/095,973

(22) Filed: Jan. 11, 2023

(65) Prior Publication Data

US 2023/0170350 A1 Jun. 1, 2023

Related U.S. Application Data

(62) Division of application No. 16/455,667, filed on Jun. 27, 2019, now Pat. No. 11,594,533.

(51) Int. Cl.
*H01L 21/8234* (2006.01)
*H01L 27/088* (2006.01)
*H01L 29/66* (2006.01)

(52) U.S. Cl.
CPC .. *H01L 27/0886* (2013.01); *H01L 21/823431* (2013.01); *H01L 21/823481* (2013.01); *H01L 29/66545* (2013.01)

(58) Field of Classification Search
CPC ..... H01L 21/823431; H01L 21/823481; H01L 27/0886; H01L 29/66545
USPC .......................................................... 438/283
See application file for complete search history.

(56) References Cited

U.S. PATENT DOCUMENTS

2020/0312658 A1* 10/2020 Miura ................. H01L 29/1054
2020/0343241 A1  10/2020 Wu

\* cited by examiner

*Primary Examiner* — Hoai V Pham
(74) *Attorney, Agent, or Firm* — Schwabe, Wuilliamson & Wyatt, P.C.

(57) ABSTRACT

A device is disclosed. The device includes a first semiconductor fin, a first source-drain epitaxial region adjacent a first portion of the first semiconductor fin, a second source-drain epitaxial region adjacent a second portion of the first semiconductor fin, a first gate conductor above the first semiconductor fin, a gate spacer covering the sides of the gate conductor, a second semiconductor fin below the first semiconductor fin, a second gate conductor on a first side of the second semiconductor fin and a third gate conductor on a second side of the second semiconductor fin, a third source-drain epitaxial region adjacent a first portion of the second semiconductor fin, and a fourth source-drain epitaxial region adjacent a second portion of the second semiconductor fin. The device also includes a dielectric isolation structure below the first semiconductor fin and above the second semiconductor fin that separates the first semiconductor fin and the second semiconductor fin.

20 Claims, 7 Drawing Sheets

STACKED TRIGATE TRANSISTORS WITH DIELECTRIC ISOLATION AND PROCESS FOR FORMING SUCH

CROSS-REFERENCE TO RELATED APPLICATIONS

This application is a division of U.S. patent application Ser. No. 16/455,667, filed on Jun. 27, 2019, the entire contents of which is hereby incorporated by reference herein.

TECHNICAL FIELD

Embodiments of the disclosure pertain to devices having stacked tri-gate transistors and, in particular, to devices having stacked tri-gate transistors with dielectric isolation.

BACKGROUND

Stacked Tri-gate (Fin-on-Fin) transistors require a dielectric layer to isolate top and bottom fin channels. In some approaches bonding is used to create dielectric isolation between the top and the bottom fin channels. However, sub-30 nm dielectric isolation is not achievable using such approaches. The inability to reduce the thickness of the dielectric isolation between the top and the bottom fin channels imperils performance as transistors are scaled to smaller sizes.

DESCRIPTION OF THE EMBODIMENTS

Stacked tri-gate transistors are described. It should be appreciated that although embodiments are described herein with reference to example stacked tri-gate transistor implementations, the disclosure is more generally applicable to stacked tri-gate transistor implementations as well as other type stacked tri-gate transistor implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Stacked Tri-gate (Fin-on-Fin) transistors require a dielectric layer to isolate top and bottom fin channels. In some approaches a bonding material is used to isolate the top and bottom fin channels. However, sub-30 nm isolation layer thicknesses are unachievable using such approaches. The inability to reduce the thickness of the dielectric isolation between the top and the bottom fin channels limits performance gains as device sizes are scaled.

An approach that addresses the shortcomings of previous approaches is disclosed and described herein. In an embodiment, vertically stacked fin on fin transistors (such as CMOS transistors) are provided with a thin dielectric layer that separates the two fin channels. Because of the space that is freed, area scaling is enabled using either current or relaxed design rules. In an embodiment, the design includes a transistor structure with stacked FinFET channels and a thin dielectric layer ($SiO_2$, SiON, SiCN, SiCON, $Al_2O_3$, $AlSiO_x$, $HfO_2$, $HfSiO_x$, $TaO_2$, or TaSiOx) that separates the channels. In an embodiment, the process described herein is compatible with, but is not limited to, gate all around (GAA) fabrication processes and is readily implementable without the need of layer transfer.

Figure 1A:
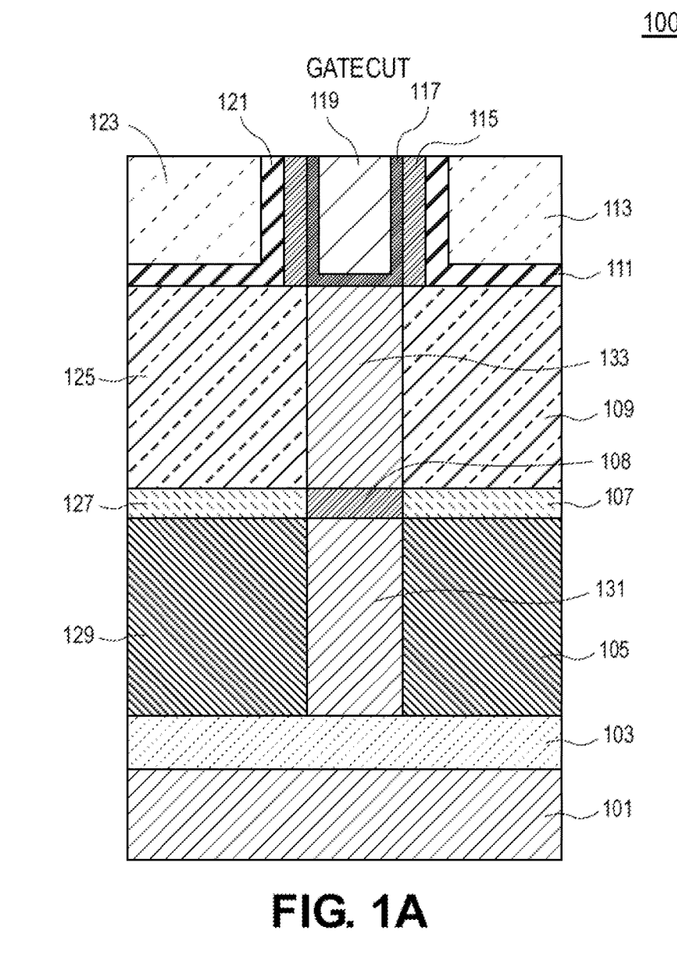
FIG. 1A illustrates a gate cut perspective of a stacked tri-gate transistor with a thin isolation structure according to an embodiment.
Figure 1B:
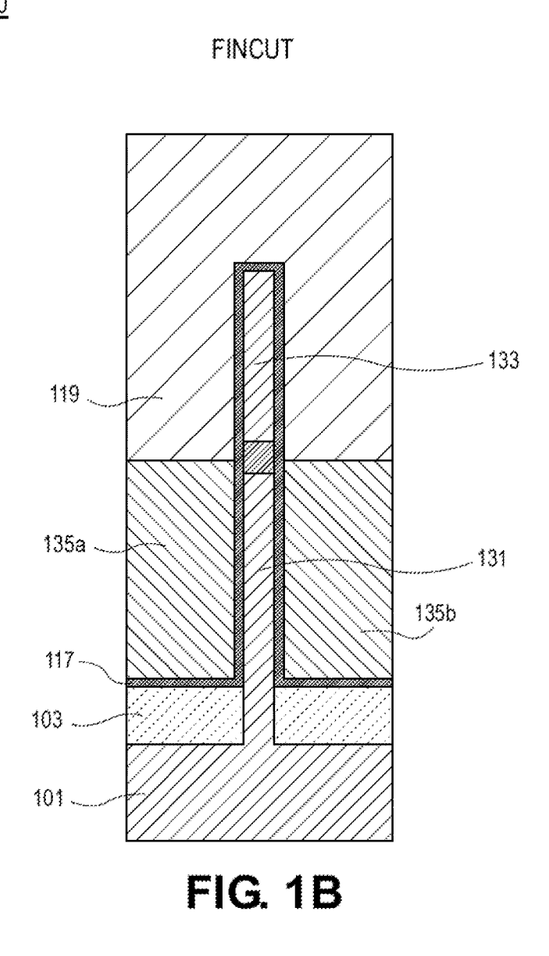
FIG. 1B illustrates a fin cut perspective of a stacked tri-gate transistor with a thin isolation structure according to an embodiment.

FIG. 1A illustrates a gate cut perspective of a stacked tri-gate transistor 100 with a thin isolation structure according to an embodiment. In FIG. 1A, the stacked tri-gate transistor 100 includes substrate 101, shallow trench isolation (STI) 103, source-drain epitaxial region 105, isolation structure 107, fin isolation structure 108, source-drain epitaxial region 109, etch stop layer 111, interlayer dielectric (ILD) 113, dielectric layer 115, high-k layer 117, gate conductor 119, etch stop layer 121, ILD 123, source-drain epitaxial region 125, isolation structure 127, source-drain epitaxial region 129, fin 131 and fin 133. FIG. 1B illustrates a fin cut perspective of the stacked tri-gate transistor 100 with thin fin isolation structure. FIG. 1B is a fin cut perspective of the stacked tri-gate transistor 100 and shows in addition to the structures shown in FIG. 1A pmos gate conductor 135a and pmos gate conductor 135b.

Referring to FIG. 1A, in an embodiment, the STI 103 can be formed on the substrate 101 and adjacent the bottom of fin 131. In an embodiment, the source-drain epitaxial region 129 can be formed on a first side of fin 131 and the source-drain epitaxial region 105 can be formed on a second side of fin 131. In an embodiment, the isolation structure 127 can be formed above source-drain region 129 and isolation structure 107 can be formed above source-drain region 105. In an embodiment, the fin isolation structure 108 can be formed above fin 131 and below fin structure 133. In an embodiment, the fin isolation structure 108 can include the same material that is included in the dielectric layer (gate spacer) 115. In an embodiment, the fin isolation structure 108 can include an internal physical interface. In an embodiment, the fin isolation structure 108 can include a low-k material. In an embodiment, the thickness of the fin isolation structure 108 can be 10-50 nm. In an embodiment, the thickness of the isolation structure 107 and the isolation structure 127 can be 5-50 nm. In an embodiment, the isolation structures 107 and 127 and the fin isolation structure 108 can be structured to ensure that the first source-drain region and the second source-drain region are isolated from the second fin. In addition, in an embodiment, the isolation structures 107 and 127 and the fin isolation structure 108 can be structured to ensure that the third source-drain region and the fourth source-drain region are isolated from the first fin. In an embodiment, the source-drain epitaxial region 125 can be formed adjacent a first side of the fin 133 and the source-drain region 109 can be formed adjacent a second side of the fin 133. In an embodiment, a first portion of the etch stop layer 111 can be formed between the ILD 113 and the source-drain region 109 and a second portion of the etch stop layer 111 can be formed between the ILD 113 and the dielectric layer 115. In an embodiment, a first portion of the etch stop layer 121 can be formed between the ILD 123 and the source-drain region 125 and a second portion of the etch stop layer 121 can be formed between the ILD 123 and the dielectric layer 115 (dielectric layer 115 can be formed at first and second sides of the gate conductor 119). In an embodiment, the ILD 113 can be formed above the source-drain region 109. In an embodiment, the ILD 123 can be formed above the source-drain region 125. In an embodiment, the gate conductor 119 can be formed above the fin 133. In an embodiment, the dielectric layer 115 can be formed on portions of the high-k layer 117 adjacent the sides of the gate conductor 119. In FIG. 1A, from the gate cut perspective the high-k layer 117 is shown as covering the sides and bottom of the gate conductor 119.

Referring to FIG. 1B, in an embodiment, the high-k layer 117 can be formed above the STI layer 103 and adjacent the sides of the fin 131 and the fin 133. In an embodiment, as shown in FIG. 1B, the high-k layer 117 can also cover the top of the fin 133. In an embodiment, the gate conductor 135a can be formed adjacent a first side of the fin 131 and the gate conductor 135b can be formed adjacent a second side of the fin 131. In an embodiment, the gate conductor 119 can be formed above the top of the fin 133 and adjacent both sides of the fin 133.

In an embodiment, the STI 103 can be formed from SiO$_2$. In other embodiments, the STI 103 can be formed from other materials. In an embodiment, the source-drain epitaxial region 105 can be formed from boron doped SiGe. In other embodiments, the source-drain epitaxial region 105 can be formed from other materials. In an embodiment, the isolation structure 107 can be formed from SiO$_2$. In other embodiments, the isolation structure 107 can be formed from other materials. In an embodiment, the fin isolation structure 108 can be formed from SiO$_2$, SiON, SiCN, SiCON, Al$_2$O$_3$, AlSiO$_x$, HfO$_2$, HfSiO$_x$, TaO$_2$, or TaSiOx. In other embodiments, the fin isolation structure 108 can be formed from other materials. In an embodiment, the source-drain epitaxial region 109 can be formed from phosphorous doped Si. In other embodiments, the source-drain epitaxial region 109 can be formed from other materials. In an embodiment, the etch stop layer 111 can be formed from a nitride material. In other embodiments, the etch stop layer 111 can be formed from other materials. In an embodiment, the ILD 113 can be formed from SiO$_2$, HfSiO$_4$, or ZrSiO$_4$. In other embodiments, the ILD 113 can be formed from other materials. In an embodiment, the dielectric layer 115 can be formed from SiON. In other embodiments, the dielectric layer 115 can be formed from other materials. In an embodiment, the high-k layer 117 can be formed from SiO$_2$. In other embodiments, the high-k layer 117 can be formed from other materials. In an embodiment, the gate conductor 119 can be an nmos gate conductor. In other embodiments, the gate conductor can be another type gate conductor. In an embodiment, the gate conductor 119 can be formed from hafnium, zirconium, titanium, tantalum, aluminum, or alloys of these metals. In other embodiments, the gate conductor 119 can be formed from other materials. In an embodiment, the etch stop layer 121 can be formed from a nitride material. In other embodiments, the etch stop layer 121 can be formed from other material. In an embodiment, the ILD 123 can be formed from SiO$_2$, HfSiO$_4$, or ZrSiO$_4$. In other embodiments, the ILD 123 can be formed from other materials. In an embodiment, the source-drain epitaxial region 125 can be formed phosphorous doped Si. In other embodiments, the source-drain epitaxial region 125 can be formed from other materials. In an embodiment, the isolation structure 127 can be formed from SiO$_2$. In other embodiments, the isolation structure 127 can be formed from other materials. In an embodiment, the source-drain epitaxial region 129 can be formed from boron doped SiGe. In other embodiments, the source-drain epitaxial region 129 can be formed from other materials. In an embodiment, the gate conductors 135a and 135b (as viewed from the FIG. 1B fin cut perspective) can be pmos gate conductors. In other embodiments, the gate conductors 135a and 135b can be other type conductors. In an embodiment, the gate conductors 135a and 135b can be formed from ruthenium, palladium, platinum, cobalt, nickel, or conductive metal oxides. In other embodiments, the gate conductors 135a and 135b can be formed from other materials. In an embodiment, the fin 133 can be formed form silicon. In other embodiments, the fin 133 can be formed from other materials. In an embodiment, the fin 131 can be formed from silicon. In other embodiments, the fin 131 can be formed from other materials.

In operation, the stacked tri-gate transistor 100 is designed to enable better performance than can be provided by conventional CMOS transistors. For example, in embodiments, because of its stacked design, that uses a very thin fin isolation structure 108, a CMOS cell with a significantly smaller footprint can be achieved. The vertical dimension can be used to provide increased contact area and increased gate length. The increased contact area enables lower contact resistance and the increased gate length enables greater intrinsic current control. Accordingly, a higher performance CMOS circuit can be provided in a smaller area.

Figure 2A:
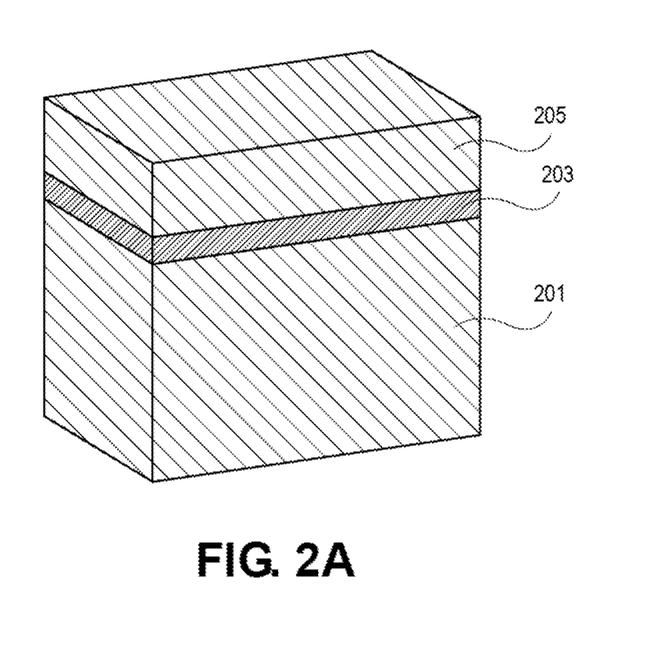
FIGS. 2A-2E illustrate cross-sections of a semiconductor structure at stages during the fabrication of a stacked tri-gate transistor with a self-aligned thin isolation structure according to an embodiment.

FIGS. 2A-2E shows cross-sections of a semiconductor structure at stages during the fabrication of a stacked tri-gate transistor with a self-aligned thin fin isolation structure according to an embodiment. Referring to FIG. 2A, after a plurality of operations the semiconductor structure includes substrate 201, SiGe layer 203, and silicon layer 205. The SiGe 203 layer is formed on the substrate 201. The silicon layer 205 is formed on the SiGe layer 203.

Figure 2B:
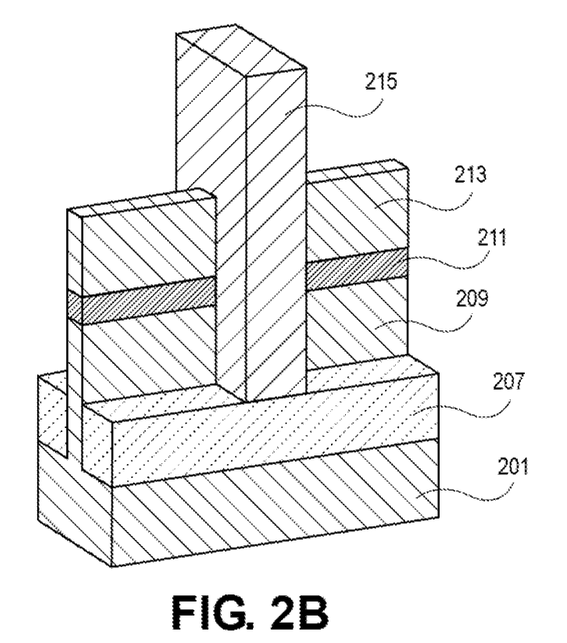

Referring to FIG. 2B, subsequent to one or more operations that result in a cross-section of the structure shown in FIG. 2A, stacked fins are patterned in the semiconductor structure that includes bottom fin 209, spacer layer 211, and top fin 213. Additionally, a dummy gate 215 is patterned and formed to cover portions of the top and side surfaces of the stacked fins. In addition, STI material 207 is formed adjacent each side of the bottom fin 209. In an embodiment, the STI material 207 can be formed by atomic layer deposition (ALD), physical vapor deposition (PVD), chemical vapor deposition (CVD), electrochemical deposition (ECD), or molecular beam epitaxy (MBE). In other embodiments, the STI material 207 can be formed in other manners.

Figure 2C:
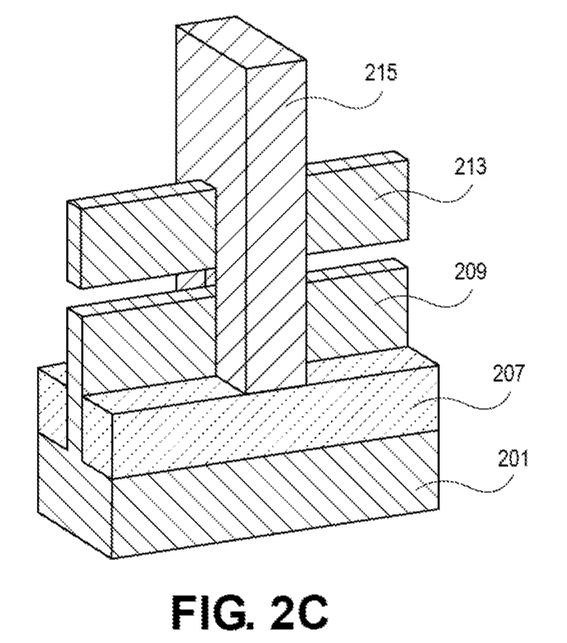

Referring to FIG. 2C, after one or more operations that result in the cross-section shown in FIG. 2B, a selective etch is applied to remove the spacer layer 211 (e.g., the remaining portions of the SiGe layer 203) leaving intact bottom fin 209 and top fin 213. In an embodiment, the selective etch can be performed by isotropic, anisotropic, plasma etching, ion milling or sputter etching. In other embodiments, the selective etch can be performed in other manners.

Figure 2D:
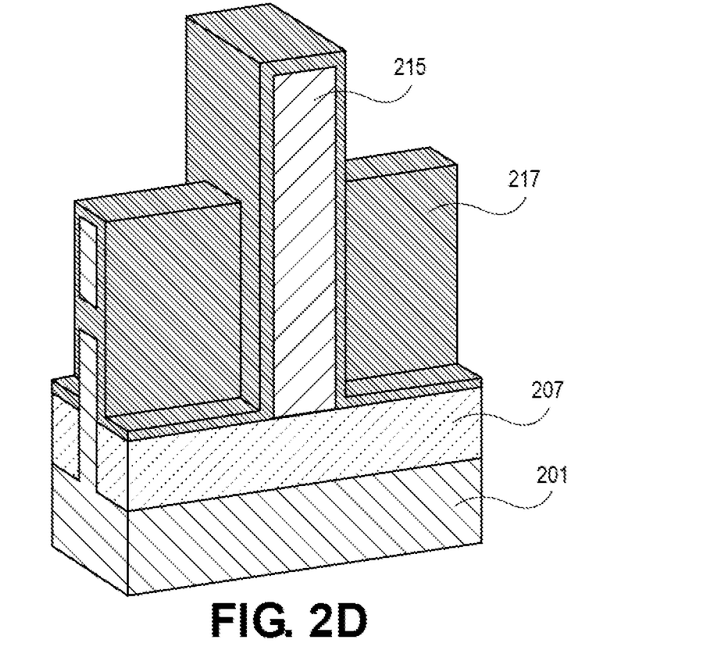

Referring to FIG. 2D, after one or more operations that result in a cross-section shown in FIG. 2C, a conformal dielectric film 217 is formed around the fins 209 and 213, the dummy gate 215 and above the STI material 207. In an embodiment, the conformal dielectric film 217 can be formed from $SiO_2$, SiON, SiCN, SiCON, $Al_2O_3$, $AlSiO_x$, $HfO_2$, $HfSiO_x$, $TaO_2$, or $TaSiO_x$. In other embodiments, the conformal dielectric film 217 can be formed from other materials. In an embodiment, the conformal dielectric layer can be formed by atomic layer deposition (ALD), physical vapor deposition (PVD), chemical vapor deposition (CVD), electrochemical deposition (ECD), or molecular beam epitaxy (MBE).

Figure 2E:
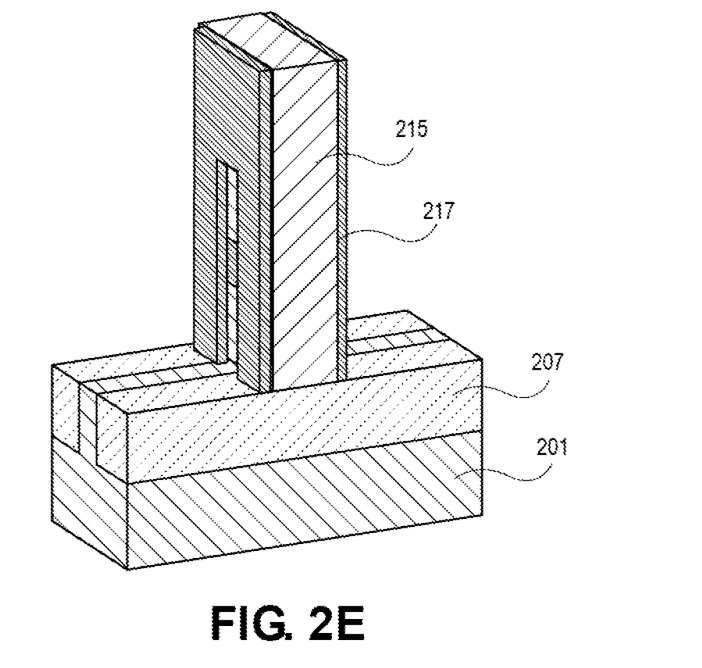

Referring to FIG. 2E, after one or more operations that result in a cross-section shown in FIG. 2D, using a highly anisotropic etch process, portions of the dielectric film 217 and portions of bottom fin 209 and the top fin 213 (in the source-drain regions) are etched down to the STI material 207. In an embodiment, after the etch, portions of the dielectric film 217 are left adjacent the polysilicon gate sidewalls and in the space between the fins under the polysilicon gate. Subsequently, n and p epitaxial source-drain regions and dual metal gates (NMOS and PMOS) are formed in addition to other transistor parts involved in CMOS device operation.

Figure 3:
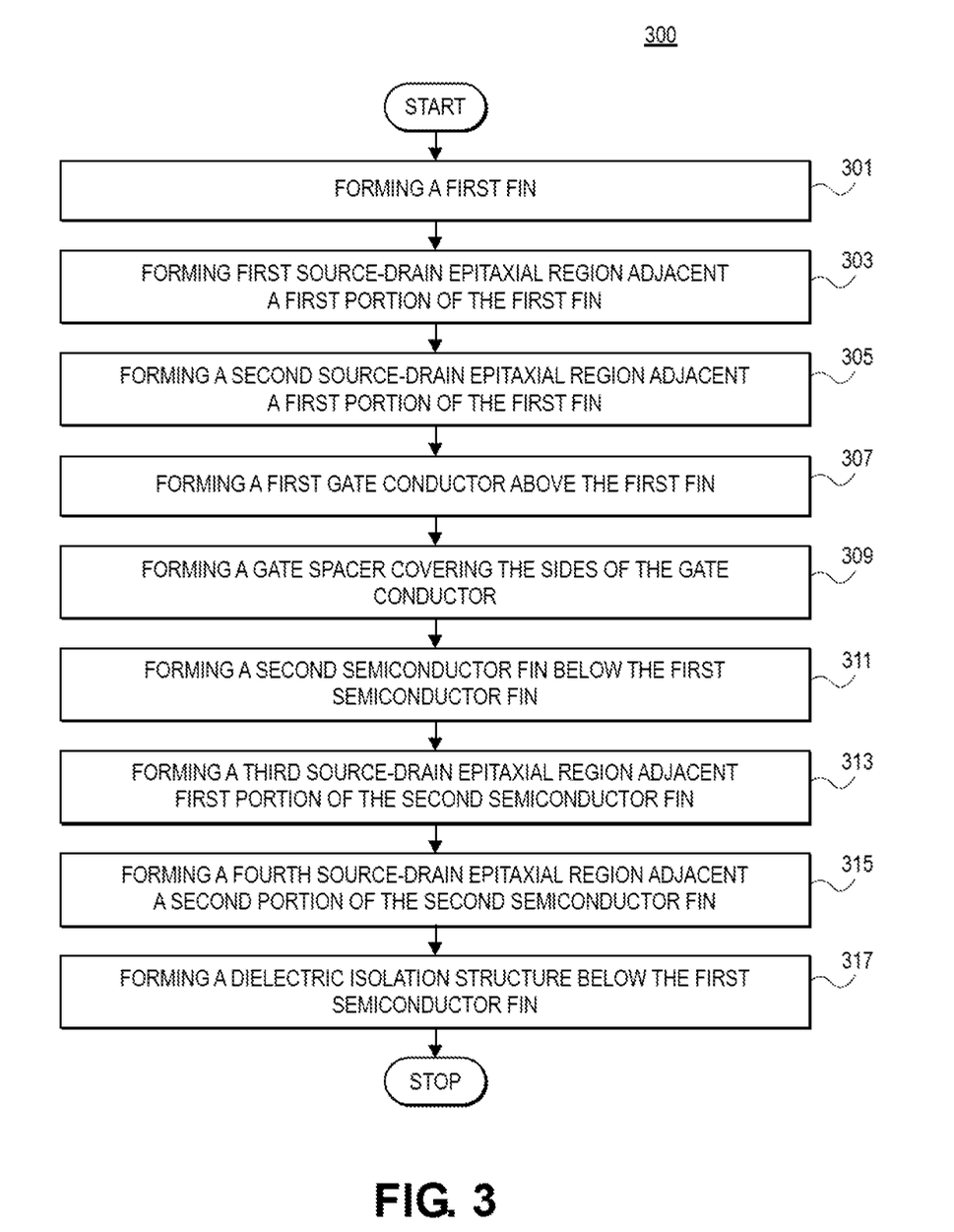
FIG. 3 illustrates a flowchart of a process of fabricating a stacked tri-gate transistor with a thin isolation structure according to an embodiment.

FIG. 3 illustrates a flowchart of a method for fabricating a stacked tri-gate transistor with a thin isolation structure according to an embodiment. Referring to FIG. 3, the method includes, at 301, forming a first semiconductor fin. At 303, forming a first source-drain epitaxial region adjacent a first portion of the first semiconductor fin. At 305, forming a second source-drain epitaxial region adjacent a second portion of the first semiconductor fin. At 307, forming a first gate conductor above the first semiconductor fin. At 309, forming a gate spacer covering the sides of the gate conductor. At 311, forming a second semiconductor fin below the first semiconductor fin. At 313, forming a third source-drain epitaxial region adjacent a first portion of the second semiconductor fin. At 315, forming a fourth source-drain epitaxial region adjacent a second portion of the second semiconductor fin. At 317, forming a dielectric isolation structure below the first semiconductor fin and above the second semiconductor fin and separating the first semiconductor fin and the second semiconductor fin.

Referring to FIG. 3, in an embodiment, a first source-drain isolation structure is formed between the first source-drain epitaxial region and the third source-drain epitaxial region and a second source-drain isolation structure between the second source-drain epitaxial region and the fourth source-drain epitaxial region. In an embodiment, the dielectric isolation structure includes the same material that is included in the gate spacer. In an embodiment, the dielectric isolation structure includes an internal physical interface. In an embodiment, the first source-drain region and the second source-drain region are isolated from the second fin. In an embodiment, the third source-drain region and the fourth source-drain region are isolated from the first fin. In an embodiment, the dielectric isolation structure includes a low-k material. In an embodiment, the thickness of the dielectric isolation structure is 10-50 nm. In an embodiment, the thickness of the first source-drain isolation structure and the second source-drain isolation structure is 5-50 nm.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only FinFET transistors, it should be noted that the invention may also be carried out using planar or other nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a workfunction that is between about 4.9 eV and about 5.2 eV.

For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, or aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, or silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
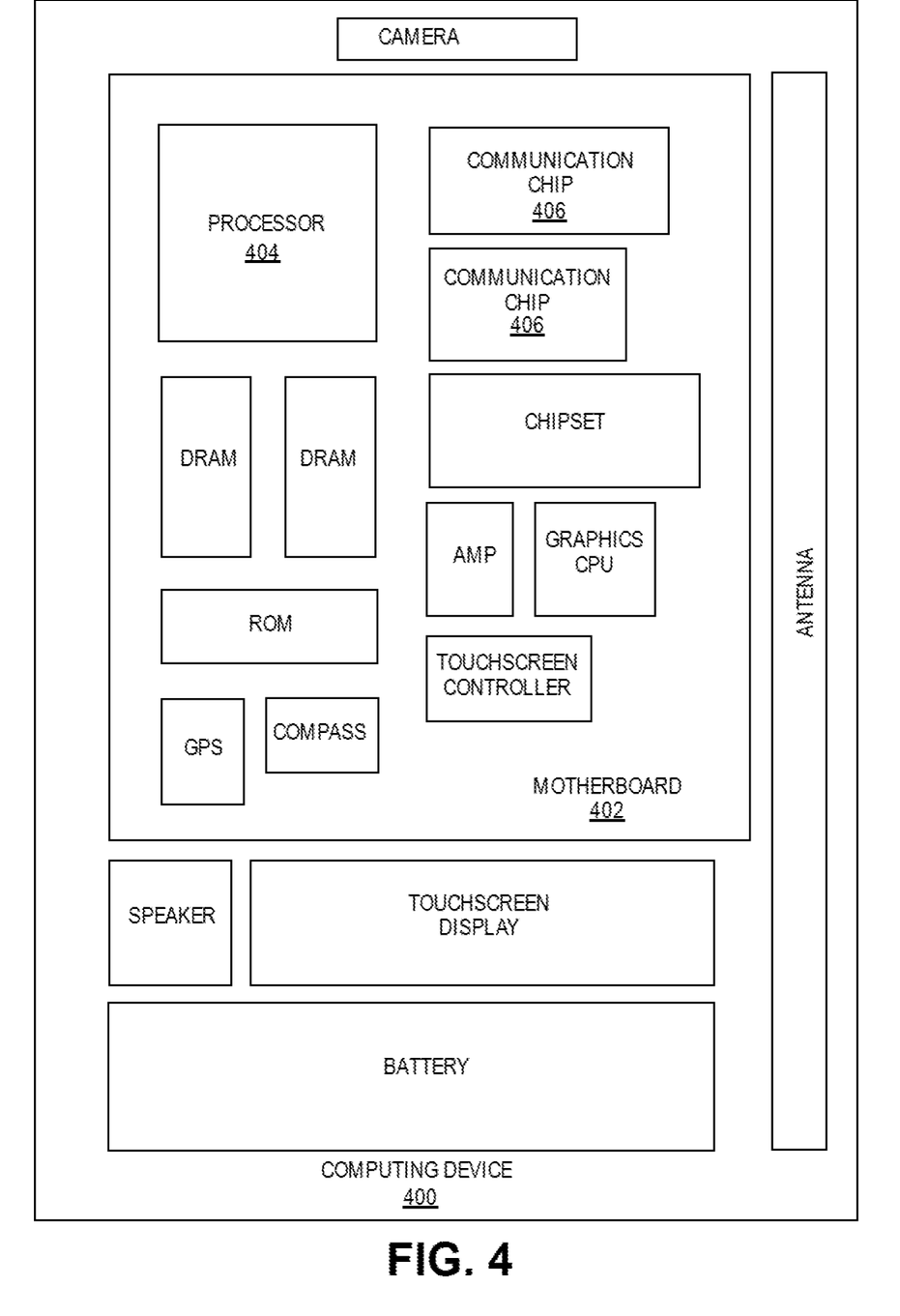
FIG. 4 illustrates a computing device in accordance with one implementation of an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, memory and or logic systems of computing device 400 (such as but not limited to DRAM and/or DRAM that is embedded in logic) can include devices such as transistor 100 described herein with reference to FIGS. 1A-1B.

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
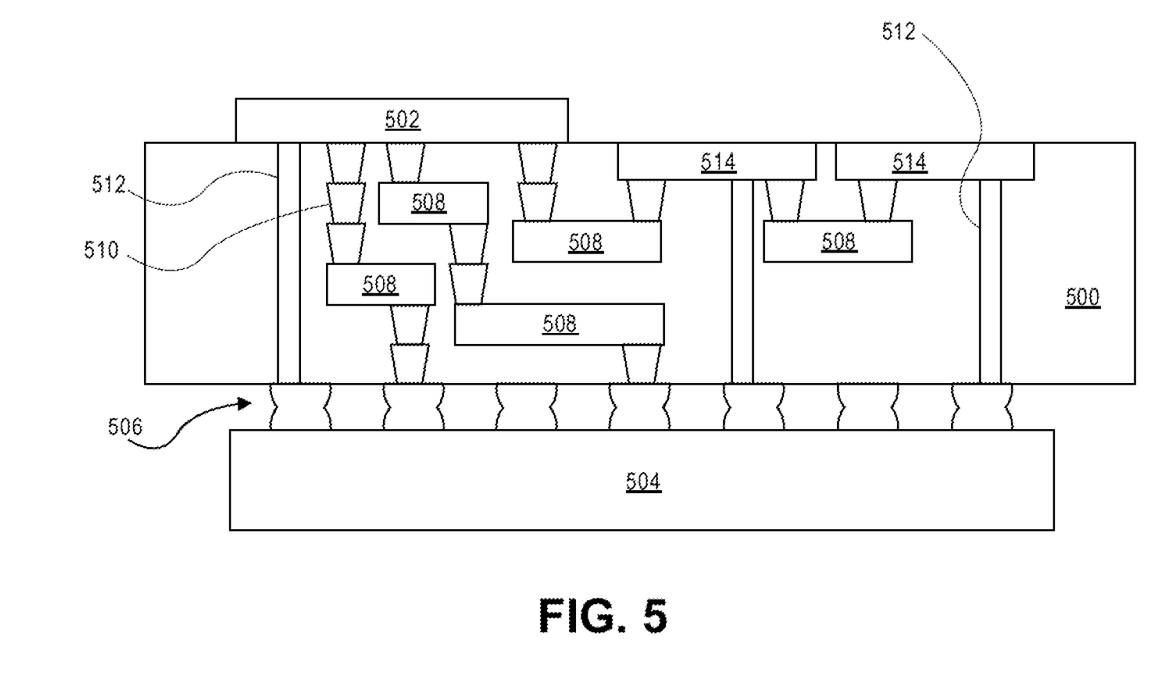
FIG. 5 illustrates an interposer that includes one or more embodiments.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1: A device, including a first semiconductor fin, a first source-drain epitaxial region adjacent a first portion of the first semiconductor fin, a second source-drain epitaxial region adjacent a second portion of the first semiconductor fin, a first gate conductor above the first semiconductor fin, a gate spacer covering the sides of the gate conductor; a second semiconductor fin below the first semiconductor fin, a second gate conductor on a first side of the second semiconductor fin and a third gate conductor on a second side of the second semiconductor fin, a third source-drain epitaxial region adjacent a first portion of the second semiconductor fin, a fourth source-drain epitaxial region adjacent a second portion of the second semiconductor fin, and a dielectric isolation structure below the first semiconductor fin and above the second semiconductor fin and separating the first semiconductor fin and the second semiconductor fin.

Example embodiment 2: The device of example embodiment 1, further comprising a first source-drain isolation structure between the first source-drain epitaxial region and the third source-drain epitaxial region and a second source-drain isolation structure between the second source-drain epitaxial region and the fourth source-drain epitaxial region.

Example embodiment 3: The device of example embodiment 1, or 2, wherein the dielectric isolation structure includes the same material that is included in the gate spacer.

Example embodiment 4: The device of example embodiment 1, 2, or 3, wherein the dielectric isolation structure includes an internal physical interface.

Example embodiment 5: The device of example embodiment 1, 2, 3, or 4, wherein the first source-drain epitaxial region and the second source-drain epitaxial region are isolated from the second fin.

Example embodiment 6: The device of example embodiment 1, 2, 3, 4, or 5, wherein the third source-drain epitaxial region and the fourth source-drain epitaxial region are isolated from the first fin.

Example embodiment 7: The device of example embodiment 1, 2, 3, 4, 5, or 6, wherein the dielectric isolation structure includes a low-k material.

Example embodiment 8: The device of example embodiment 1, 2, 3, 4, 5, 6, or 7, wherein the thickness of the dielectric isolation structure is 10-50 nm.

Example embodiment 9: The device of example embodiment 1, 2, 3, 4, 5, 6, 7, or 8 wherein the thickness of the first source-drain isolation structure and the second source-drain isolation structure is 5-50 nm.

Example embodiment 10: A system, including one or more processing components; and one or more data storage components, one or more of the processing components and the data storage components including at least one device, the at least one device including: a first semiconductor fin; a first source-drain epitaxial region adjacent a first portion of the first semiconductor fin; a second source-drain epitaxial region adjacent a second portion of the first semiconductor fin; a first gate conductor above the first semiconductor fin; a gate spacer covering the sides of the gate conductor; a second semiconductor fin below the first semiconductor fin; a second gate conductor on a first side of the second semiconductor fin and a third gate conductor on a second side of the second semiconductor fin; a third source-drain epitaxial region adjacent a first portion of the second semiconductor fin; a fourth source-drain epitaxial region adjacent a second portion of the second semiconductor fin; and a dielectric isolation structure below the first semiconductor fin and above the second semiconductor fin and separating the first semiconductor fin and the second semiconductor fin.

Example embodiment 11: The system of example embodiment 10, further comprising a first source-drain isolation structure between the first source-drain epitaxial region and the third source-drain epitaxial region and a second source-drain isolation structure between the second source-drain epitaxial region and the fourth source-drain epitaxial region.

Example embodiment 12: The system of example embodiment 10, or 11, wherein the dielectric isolation structure includes the same material that is included in the gate spacer.

Example embodiment 13: The system of example embodiment 10, 11, or 12, wherein the dielectric isolation structure includes an internal physical interface.

Example embodiment 14: The system of example embodiment 10, 11, 12, or 13, wherein the first source-drain epitaxial region and the second source-drain epitaxial region are isolated from the second fin.

Example embodiment 15: A method, comprising: forming a semiconductor substrate; forming a first semiconductor layer above the semiconductor substrate; forming a second semiconductor layer above the first semiconductor layer; patterning a first fin from portions of the semiconductor substrate, the first semiconductor layer and the second semiconductor layer; forming a dummy gate material around the fin; performing a selective etch that removes remaining portions of the first semiconductor layer to form an upper fin and a lower fin from the first fin; forming a conformal dielectric layer on the upper and lower fin, between the upper and lower fin, and on the dummy gate material; removing portions of the upper fin and the lower fin that are located on a first and a second side of the dummy gate that extend beyond the dummy gate; and forming a dielectric isolation structure and gate spacers by removing portions of the conformal dielectric layer.

Example embodiment 16: The method of example embodiment 15, wherein the dielectric isolation structure includes the same material that is included in the gate spacers.

Example embodiment 17: The method of example embodiment 15, or 16, wherein forming the dielectric isolation structure includes forming material on opposing surfaces of the upper fin and the lower fin.

Example embodiment 18: The method of example embodiment 17, wherein the material formed on opposing surfaces of the upper fin and the lower fin meet to fill the space between the upper fin and the lower fin.

Example embodiment 19: The method of example embodiment 18, wherein the material formed on opposing surfaces of the upper fin and the lower fin meet to form an internal physical interface.

Example embodiment 20: The method of example embodiment 15, 16, 17, 18, or 19, wherein forming the dummy gate includes forming polysilicon around the fin.

Example embodiment 21: The method of example embodiment 15, 16, 17, 18, 19, or 20, wherein the conformal dielectric layer includes SiN, SiON, SiCN, or SiOCN.

Example embodiment 22: A method, comprising: forming a first semiconductor fin; forming a first source-drain epitaxial region adjacent a first portion of the first semiconductor fin; forming a second source-drain epitaxial region adjacent a second portion of the first semiconductor fin; forming a first gate conductor above the first semiconductor fin; forming a gate spacer covering the sides of the gate conductor; forming a second semiconductor fin below the first semiconductor fin; forming a third source-drain epitaxial region adjacent a first portion of the second semiconductor fin; forming a fourth source-drain epitaxial region adjacent a second portion of the second semiconductor fin; and forming a dielectric isolation structure below the first semiconductor fin and above the second semiconductor fin and separating the first semiconductor fin and the second semiconductor fin.

Example embodiment 23: The method of example embodiment 22, further comprising forming a first source-drain isolation structure between the first source-drain epitaxial region and the third source-drain epitaxial region and a second source-drain isolation structure between the second source-drain epitaxial region and the fourth source-drain epitaxial region.

Example embodiment 24: The method of example embodiment 22, or 23, wherein the dielectric isolation structure includes the same material that is included in the gate spacer.

Example embodiment 25: The method of example embodiment 22, 23, or 24, wherein the dielectric isolation structure includes an internal physical interface.

What is claimed is:

1. A method, comprising:
   forming a semiconductor substrate;
   forming a first semiconductor layer above the semiconductor substrate;
   forming a second semiconductor layer above the first semiconductor layer;
   patterning a first fin from portions of the semiconductor substrate, the first semiconductor layer and the second semiconductor layer;
   forming a dummy gate material around the fin;
   performing a selective etch that removes remaining portions of the first semiconductor layer to form an upper fin and a lower fin from the first fin;
   forming a conformal dielectric layer on the upper and lower fin, between the upper and lower fin, and on the dummy gate material;
   removing portions of the upper fin and the lower fin that are located on a first and a second side of the dummy gate that extend beyond the dummy gate; and
   forming a dielectric isolation structure and gate spacers by removing portions of the conformal dielectric layer.

2. The method of claim 1, wherein the dielectric isolation structure includes the same material that is included in the gate spacers.

3. The method of claim 1, wherein forming the dielectric isolation structure includes forming material on opposing surfaces of the upper fin and the lower fin.

4. The method of claim 3, wherein the material formed on opposing surfaces of the upper fin and the lower fin meet to fill the space between the upper fin and the lower fin.

5. The method of claim 4, wherein the material formed on opposing surfaces of the upper fin and the lower fin meet to form an internal physical interface.

6. The method of claim 1, wherein forming the dummy gate includes forming polysilicon around the fin.

7. The method of claim 1, wherein the conformal dielectric layer includes SiN, SiON, SiCN, or SiOCN.

8. A method of fabricating a device, the method comprising:
   forming a first semiconductor fin;
   forming a first source-drain epitaxial region adjacent a first portion of the first semiconductor fin;
   forming a second source-drain epitaxial region adjacent a second portion of the first semiconductor fin;
   forming a first gate conductor above the first semiconductor fin;
   forming a gate spacer covering the sides of the gate conductor;
   forming a second semiconductor fin below the first semiconductor fin;
   forming a second gate conductor on a first side of the second semiconductor fin and a third gate conductor on a second side of the second semiconductor fin;
   forming a third source-drain epitaxial region adjacent a first portion of the second semiconductor fin;
   forming a fourth source-drain epitaxial region adjacent a second portion of the second semiconductor fin; and
   forming a dielectric isolation structure below the first semiconductor fin and above the second semiconductor fin and separating the first semiconductor fin and the second semiconductor fin.

9. The method of claim 8, further comprising:
   forming a first source-drain isolation structure between the first source-drain epitaxial region and the third source-drain epitaxial region and a second source-drain isolation structure between the second source-drain epitaxial region and the fourth source-drain epitaxial region.

10. The method of claim 8, wherein the dielectric isolation structure includes the same material that is included in the gate spacer.

11. The method of claim 8, wherein the dielectric isolation structure includes an internal physical interface.

12. The method of claim 8, wherein the first source-drain epitaxial region and the second source-drain epitaxial region are isolated from the second fin.

13. The method of claim 8, wherein the third source-drain epitaxial region and the fourth source-drain epitaxial region are isolated from the first fin.

14. The method of claim 8, wherein the dielectric isolation structure includes a low-k material.

15. The method of claim 8, wherein the thickness of the dielectric isolation structure is 10-50 nm.

16. The method of claim 8, wherein the thickness of the first source-drain isolation structure and the second source-drain isolation structure is 5-50 nm.

17. A method of fabricating a system, the method comprising:
   providing one or more processing components; and
   coupling one or more data storage components to the one or more processing components, one or more of the processing components or the data storage components including at least one device, the at least one device fabricated according to a method including:
   forming a first semiconductor fin;
   forming a first source-drain epitaxial region adjacent a first portion of the first semiconductor fin;
   forming a second source-drain epitaxial region adjacent a second portion of the first semiconductor fin;
   forming a first gate conductor above the first semiconductor fin;
   forming a gate spacer covering the sides of the gate conductor;
   forming a second semiconductor fin below the first semiconductor fin;
   forming a second gate conductor on a first side of the second semiconductor fin and a third gate conductor on a second side of the second semiconductor fin;
   forming a third source-drain epitaxial region adjacent a first portion of the second semiconductor fin;
   forming a fourth source-drain epitaxial region adjacent a second portion of the second semiconductor fin; and
   forming a dielectric isolation structure below the first semiconductor fin and above the second semiconductor fin and separating the first semiconductor fin and the second semiconductor fin.

18. The method of claim 17, wherein the dielectric isolation structure includes the same material that is included in the gate spacer.

19. The method of claim 17, wherein the dielectric isolation structure includes an internal physical interface.

20. The method of claim 17, wherein the first source-drain epitaxial region and the second source-drain epitaxial region are isolated from the second fin.

* * * * *